United States Patent
Canale et al.

(10) Patent No.: US 6,440,858 B1
(45) Date of Patent: Aug. 27, 2002

(54) MULTI-LAYER HARD MASK FOR DEEP TRENCH SILICON ETCH

(75) Inventors: Anthony J. Canale, Essex Junction; John E. Cronin, Milton, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/138,964

(22) Filed: Aug. 24, 1998

(51) Int. Cl.[7] ............... H01L 21/302; H01L 21/3065
(52) U.S. Cl. ............... 438/700; 438/706; 438/723; 438/724
(58) Field of Search ............... 438/700, 706, 438/424, 723, 724

(56) References Cited

U.S. PATENT DOCUMENTS

| | | | | |
|---|---|---|---|---|
| 4,568,410 A | * | 2/1986 | Thornquist | 438/724 |
| 4,717,448 A | | 1/1988 | Cox et al. | 438/714 |
| 4,857,477 A | * | 8/1989 | Kanamori | 438/386 |
| 4,983,253 A | | 1/1991 | Wolfe et al. | 438/719 |
| 4,999,312 A | * | 3/1991 | Yoon | 438/392 |
| 5,017,403 A | * | 5/1991 | Pang et al. | 427/576 |
| 5,057,443 A | * | 10/1991 | Hutter | 438/330 |
| 5,118,384 A | * | 6/1992 | Harmon et al. | 438/717 |
| 5,190,889 A | * | 3/1993 | Poon et al. | 438/437 |
| 5,275,974 A | | 1/1994 | Ellul et al. | 438/386 |
| 5,423,941 A | | 6/1995 | Komura et al. | 438/700 |
| 5,466,639 A | | 11/1995 | Ireland | 438/633 |
| 5,470,782 A | | 11/1995 | Schwalke et al. | 438/401 |
| 5,605,603 A | | 2/1997 | Grimard et al. | 438/715 |
| 5,686,345 A | * | 11/1997 | Harmon et al. | 428/36.9 |
| 5,753,562 A | * | 5/1998 | Kim | 438/424 |
| 5,811,345 A | * | 9/1998 | Yu et al. | 438/424 |
| 5,869,359 A | * | 2/1999 | Prabhakar | 438/149 |
| 5,907,771 A | * | 5/1999 | Ploessl et al. | 438/243 |
| 5,913,132 A | * | 6/1999 | Tsai | 438/434 |
| 5,928,965 A | * | 7/1999 | Shoji et al. | 438/719 |

* cited by examiner

*Primary Examiner*—Benjamin L. Utech
*Assistant Examiner*—Lynette T. Umez-Eronini
(74) *Attorney, Agent, or Firm*—DeLio & Peterson, LLC; Kelly M. Reynolds; William D. Sabo (57) ABSTRACT

A method of etching multiple films with a dual layer hard mask wherein one layer is totally removed and the other layer partially removed during deep trench etching of the silicon substrate. In particular, a method of deep trench etching silicon substrates comprising the steps of providing a semiconductor substrate capable of being etched, with $HBr/NF_3/He/O_2$, having a layer of pad dielectric disposed depositing a layer of material capable of selective removability with respect to the pad dielectric, preferably BSG; depositing a layer of material having a slower etch rate than the semiconductor substrate and the layer of material capable of selective removability with respect to the pad dielectric, preferably, silicon oxide deposited by PECVD; patterning at least one of the layers, and etching the semiconductor substrate to form a trench and removing the layer of material having a slower etch rate than the semiconductor substrate, wherein trenches are of close proximity to each other.

23 Claims, 6 Drawing Sheets

MULTI-LAYER HARD MASK FOR DEEP TRENCH SILICON ETCH

BACKGROUND OF THE INVENTION

1. Field of the Invention

This invention relates to the field of semiconductor manufacture, and more specifically to the formation of deep trenches when etching silicon.

This invention describes a process for etching multiple films with a dual layer hard mask, and specifically a process for etching deep trenches for DRAMs having a dual layer hard mask. The top hard mask is totally and the lower hard mask is partially removed while etching the deep trench.

2. Description of Related Art

In the formation of integrated circuits, it is often necessary to etch a trench in the silicon substrate. In particular, the trend towards packing more memory cells into a given chip area has led to the development of trench memory cells which require deep, narrow apertures in the silicon substrate. Trench memory cells and trench capacitors with one or more polysilicon electrodes for silicon integrated circuits have applications in structures known as dynamic random access memories (DRAMs).

Deep trench etching of the silicon substrate has many problems during the etching process and in the post-etch processing of the substrate. The side walls of trench cells and trench capacitors must be substantially vertical to minimize the amount of space consumed by the trench. However, the manufacturing sensitivity of the silicon substrate can inhibit control and precision during the etching process. In post-etch processing, hard masks used in patterning the trenches must be removed with minimal undercutting of the pad dielectric on the substrate. In addition, manufacturing costs are driven up when there are multiple masking steps, and seasoning changes in the etch tool.

U.S. Pat. No. 4,717,448 (issued Jan. 5, 1988, to Cox et al. and assigned to the assignee of the present invention), discloses a process for forming deep trenches in a silicon substrate having a layer of silicon oxide, and a photoresist layer. Undercutting of the silicon oxide can occur during deep trench etching of the substrate utilizing this method.

U.S. Pat. No. 4,983,253 (issued Jan. 8, 1991, to Wolfe et al.) discloses an apparatus and method of etching a silicon wafer having a layer of pad oxide wherein two masking layers may be used when etching the silicon. This method requires additional steps to remove the masking layers.

U.S. Pat. No. 5,275,974 (issued Jan. 4, 1994, to Ellul et al.), discloses a method of forming trench capacitor electrodes with reduced masking steps by etching a substrate coated, first, with a layer of silicon nitride as a chemical mechanical polish stop and then coated with a layer of silicon oxide to serve as a trench etch mask. The silicon oxide is removed during post-etch processing and later re-grown.

U.S. Pat. No. 5,470,782 (issued Nov. 28, 1995, to Schwalke et al.), discloses a method for producing trench structures in silicon substrates using a two-stage trench process comprising at least two etching steps utilizing multiple layers of silicon dioxide, mono- and polycrystalline silicon, and silicon nitride. The layers are etched first followed by etching of the silicon substrate. This method involves several time consuming deposition steps.

DRAMs have been manufactured with a borosilicate glass (BSG)/pad nitride hard mask and with a tetraethylorthosilicate (TEOS)/pad nitride hard mask. Following deep trench etch of the TEOS/pad nitride product, the same chamber is often used to run BSG/pad nitride product. The chamber experiences process shifts causing the BSG product to etch deeper, and erode the BSG/pad nitride hard mask. A current solution to this problem is to allow a buildup of BSG products before seasoning the chamber from the TEOS product run. After running the BSG product, the chamber must be reseasoned to prepare the chamber for running TEOS products. Dedicating chambers based on tool, process, or product differences is not a manufacturable solution since it impacts capacity. A more flexible manufacturing solution is desirable.

Bearing in mind the problems and deficiencies of the prior art, it is an object of the present invention to provide a method of deep trench etching silicon having improved control and precision to allow etching trenches of close proximity and/or with multiple dimensions and directions.

Another object of the present invention is to provide a method of deep trench etching silicon having reduced pad oxide undercut.

It is yet another object of the present invention to provide a method of deep trench etching silicon having improved post-etch processing.

A further object of the present invention is to provide a silicon substrate for etching a plurality of trenches within close proximity.

A still further object of the present invention is to provide a silicon substrate for etching a plurality of trenches having multiple dimensions and directions.

Yet another object of the present invention is to provide an improved manufacturing process for deep trench etching of DRAMs.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of etching a plurality of trenches in a semiconductor substrate. The method comprises the steps of: (a) providing a semiconductor substrate capable of being etched with a first etchant, having a layer of pad dielectric disposed thereon; (b) depositing a layer of material capable of selective removability with respect to the pad dielectric; (c) depositing a layer of material having a slower etch rate than the semiconductor substrate and the layer of material capable of selective removability with respect to the pad dielectric when contacted with the first etchant; (d) patterning at least one of the layers to form a pattern for the trench; (e) etching through the layers; and (f) contacting the semiconductor substrate with the first etchant to form the trench and removing the layer of material having a slower etch rate than the semiconductor substrate.

Preferably, in step (b) the layer of material capable of selective removability with respect to the pad dielectric is borosilicate glass (BSG). Preferably, in step (c) the layer of material having a slower etch rate than the semiconductor substrate when contacted with the first etchant is a layer of silicon oxide deposited by plasma enhanced chemical vapor deposition.

Preferably, during step (e) etching of the pad dielectric, the layer of material capable of selective removability with respect to the pad dielectric, and the layer of material having a slower etch rate than the semiconductor substrate, there is no substantial etching of the semiconductor substrate.

Preferably, etching of the silicon substrate comprises reactive ion etching with an etchant comprising hydrogen bromide gas, nitrogen triflouride, with oxygen and helium. Most preferably, during etching of the silicon substrate, the nitrogen triflouride completely removes the layer of silicon oxide.

Preferably, further including in step (f) removing any remaining layer of material capable of selective removability with respect to the pad dielectric, and removing the layer of material having a slower etch rate than the semiconductor substrate when contacted with the first etchant comprising dipping the semiconductor substrate in a hydrogen fluoride-sulfuric acid bath selective to the layer of pad dielectric and the silicon substrate.

A first preferred sequence of the first three steps is: first, providing a semiconductor substrate capable of being etched with a first etchant, having a layer of pad dielectric disposed thereon; followed by depositing a layer of material capable of selective removability with respect to the pad dielectric; then depositing a layer of material having a slower etch rate than the semiconductor substrate and the layer of material capable of selective removability with respect to the pad dielectric when contacted by the first etchant; and followed by steps (d) through (f).

A second preferred sequence of the first three steps is: first, providing a semiconductor substrate capable of being etched with a first etchant, having a layer of pad dielectric disposed thereon; followed by depositing a layer of material having a slower etch rate than the semiconductor substrate when contacted by the first etchant; then depositing a layer of material capable of selective removability with respect to the pad dielectric; and followed by steps (d) through (f).

The second preferred sequence may further include, after step (f) wherein a first trench is formed, the steps of: (g) completely removing the layer of material capable of selective removability with respect to the pad dielectric; (h) filling the first silicon trench; (i) depositing a subsequent layer of material capable of selective removability with respect to the pad dielectric; (j) patterning the layers; and (k) etching a subsequent trench in the semiconductor substrate, wherein the subsequent trench can have a different dimension and direction than the first trench.

In another aspect, the present invention relates to a method of etching trenches of close proximity on a silicon substrate. The method comprising the steps of: (a) providing a silicon substrate capable of being etched with a first etchant; (b) depositing a layer of pad dielectric over the silicon substrate; (c) depositing a layer of BSG over the layer of pad dielectric; (d) depositing a layer of silicon oxide over the layer of BSG; (e) applying a resist layer and exposing the pattern on the layers of silicon oxide, BSG and pad dielectric; (f) etching the layers of silicon oxide, BSG and pad dielectric; (g) stripping the remaining resist layer; and (h) contacting the silicon substrate with first etchant to form the trenches while removing at least a portion of the layer of silicon oxide.

The method of etching trenches of close proximity may further include steps (i) removing any remaining layers of silicon oxide and BSG; and (j) growing a node insulator film within the trenches and filling the trenches with polysilicon.

Preferably, in step (c) the layer of BSG is thicker than the layer of silicon oxide. Preferably, in step (d) the layer of silicon oxide is deposited by plasma enhanced chemical vapor deposition. Preferably, during step (f) etching of the pad dielectric, the layer of material capable of selective removability with respect to pad dielectric, and the layer of material having a slower etch rate than the semiconductor substrate, there is no substantial etching of the semiconductor substrate.

During step (h) wherein the silicon substrate is contacted with the first etchant to form the trenches while removing at least a portion of the layer of silicon oxide, the layer of silicon oxide protects the layer of BSG during etching of the silicon substrate. The rate of erosion of the layer of BSG is reduced and the rate of etching of the silicon substrate is better controlled than with a layer of BSG alone.

In yet another aspect, the present invention relates to a method of etching a plurality of trenches having different dimensions and directions in a silicon substrate. The method comprises the steps of: (a) providing a silicon substrate capable of being etched with a first etchant, having a layer of pad dielectric over the silicon substrate, a first layer of silicon oxide deposited over the layer of pad dielectric by plasma enhanced chemical vapor deposition, a layer of BSG deposited over the first layer of silicon oxide; (b) etching the layers of pad dielectric, silicon oxide and BSG in accordance with a desired pattern; (c) contacting the silicon substrate with the first etchant to produce the plurality of trenches in the silicon substrate; and (d) removing the layer of BSG with an etchant selective to the first layer of silicon oxide to provide a planar surface on the first layer of silicon oxide after removing the layer of BSG. According to the present method the first layer of silicon oxide and the layer of BSG are of substantially equal thicknesses.

Wherein step (c) forms a first plurality of trenches, the present aspect further includes the steps of: (e) growing a first layer of node insulator onto the walls of the trenches then filling the first plurality of trenches with polysilicon; and (f) removing any excess polysilicon and node insulator forming a planar surface on the first layer of silicon oxide. The step of removing any excess polysilicon and node insulator comprises chemical mechanical polishing of the excess polysilicon to achieve a surface planar to the layer of silicon oxide.

The etching of subsequent trenches further includes the steps of: (g) depositing a subsequent layer of silicon oxide, preferably, having a thickness of about 2000 Å to about 4000 Å, over the first layer of silicon oxide by plasma enhanced chemical vapor deposition; (h) etching through the first and subsequent layers of silicon oxide, and the layer of pad dielectric; (i) etching subsequent silicon trenches; (j) removing the first and subsequent layers of silicon oxide; (k) growing a subsequent layer of node insulator onto the walls of the subsequent trenches and filling the subsequent trenches with polysilicon; and (l) removing any excess polysilicon and node insulator down to the layer of pad dielectric. The subsequent trenches etched can have different dimensions and directions than the first plurality of silicon trenches.

Preferably, in step (l) the removal of any excess polysilicon and node insulator comprises chemical mechanical polishing to achieve a surface planar to the layer of pad dielectric.

In still yet another aspect, the present invention relates to an intermediate silicon substrate for use in deep trench etching comprising: a silicon substrate; a layer of pad dielectric disposed on the silicon substrate; a layer of BSG disposed on the layer of pad dielectric; a layer of silicon oxide disposed on the layer of BSG by plasma enhanced chemical vapor deposition; and a resist layer disposed on the layer of silicon oxide, wherein the layer of silicon oxide provides a sacrificial layer protecting the layer of BSG to minimize moisture sensitivity of the layer of BSG during deep trench etching of the silicon substrate. The intermediate silicon substrate is for use in etching a plurality of trenches within close proximity.

In still yet another aspect, the present invention relates to an intermediate silicon substrate for use in deep trench etching comprising: a silicon substrate; a layer of pad dielectric disposed on the silicon substrate; a layer of silicon oxide disposed on the layer of pad dielectric by plasma enhanced chemical vapor deposition; a layer of BSG disposed on the layer of silicon oxide; and a resist layer. The intermediate silicon substrate is for use in deep trench etching a plurality of trenches of same or differing dimensions and directions.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

It should be understood that the drawings herein are not to scale but are merely schematic representations and are not intended to portray the specific parameters or the structural details of the invention, which can be determined by one of skill in the art by examination of the information herein.

DESCRIPTION OF THE PREFERRED EMBODIMENT(S)

In describing the preferred embodiments of the present invention, reference will be made herein to FIGS. 1–18 of the drawings in which like numerals refer to like features of the invention. Features of the invention are not necessarily shown to scale in the drawings.

Figure 1:
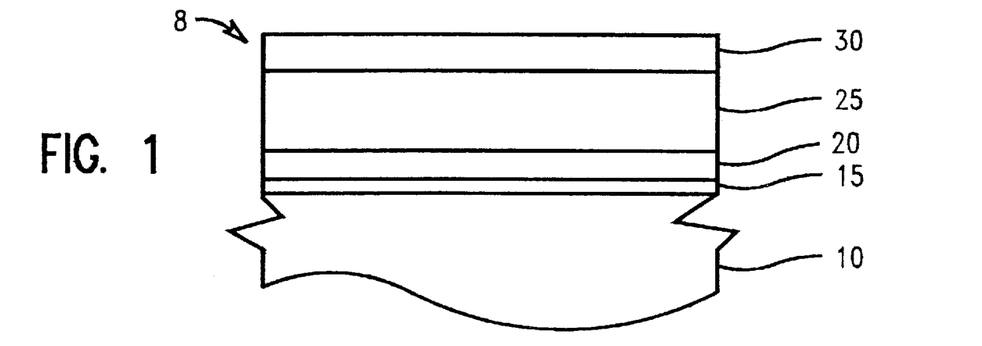
FIGS. 1–7 are elevational cross-sectional views showing a portion of a layered substrate of a specific preferred embodiment of the present invention showing the steps of a method of etching deep trenches of close proximity in silicon substrates.

FIGS. 1–7 show a specific preferred embodiment of the method of deep trench silicon etching wherein the trenches are of close proximity. In FIG. 1, a method of etching trenches of close proximity on a semiconductor substrate comprises the steps of depositing a pad dielectric layer and a hard mask layer on silicon substrate 10 to form layered intermediate substrate 8. The pad dielectric layer comprises a first layer 15, preferably, silicon oxide, deposited on the substrate 10 followed by a second layer 20, preferably, silicon nitride, deposited over the first layer 15. A dual layer hard mask is then formed over the pad dielectric layer. The lower layer in the hard mask, or first layer, comprises a material 25 that etches selectively to the pad dielectric. The top layer in the hard mask, or the second layer, comprises a material 30 that etches at a slower rate than silicon and to the material 25 of the first layer of the hard mask. Preferably, the first layer of the hard mask 25 is BSG deposited over the first layer of the pad dielectric 20. Preferably, the second layer of the hard mask 30 is silicon oxide deposited on the BSG by plasma enhanced chemical vapor deposition (PECVD oxide). All layers are deposited according to known methods in the art.

Figure 2:
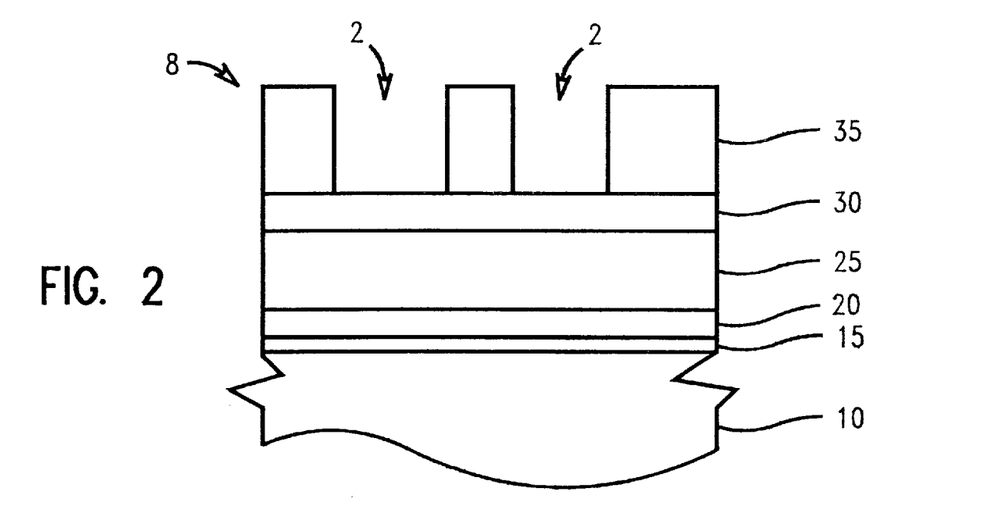
Figure 3:
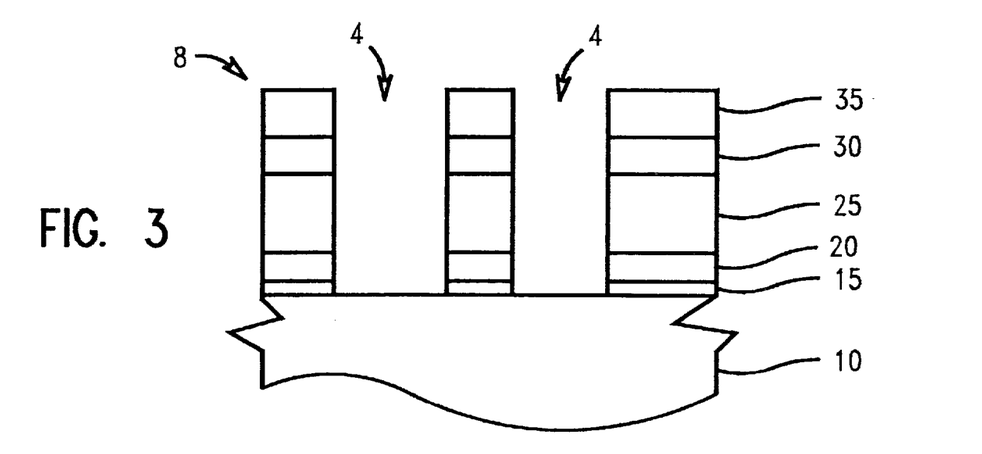

In the next series of steps shown in FIG. 2, layered intermediate substrate 8 is coated and patterned with resist layer 35 forming contact areas 2 in the PECVD oxide 30. FIG. 3 shows the subsequent etching of the layers of PECVD oxide 30, BSG 25, silicon nitride 20, and silicon oxide 15 leaving contact areas 4 on substrate 10. The patterning of the hard mask layers and the pad dielectric layers can be accomplished by reactive ion etching with conventional etchants known in the art. A reactive ion etching process with $CHF_3/CF_4$/Argon (Ar) chemistry is suitable for this purpose. Any remaining resist layer 35 not eroded during etching of the layers is removed.

Figure 4:
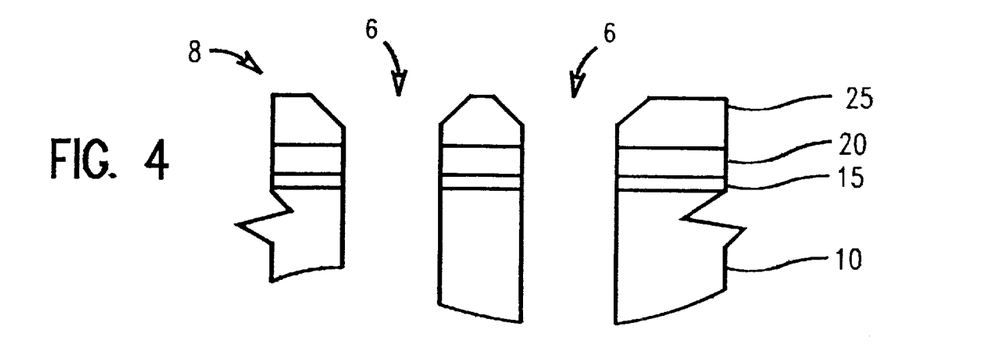

The substrate 10 is then etched in accordance to the pattern of the hard mask and pad dielectric layers producing trenches 6, as shown in FIG. 4, to a desired depth. Substrate 10 may be etched using reactive ion etchants such as $HBr/NF_3/He/O_2$.

It should be noted that the PECVD oxide 30 is capable of being completed eroded and the BSG 25 being partially eroded during etching of substrate 10. The PECVD oxide 30 acts as a sacrificial hard mask layer protecting the BSG 25 during deep trench etching of substrate 10. When using a BSG hard mask layer alone, the moisture sensitivity of both the BSG and the etchants causes the silicon to etch faster thus, less controlled etching.

Figure 5:
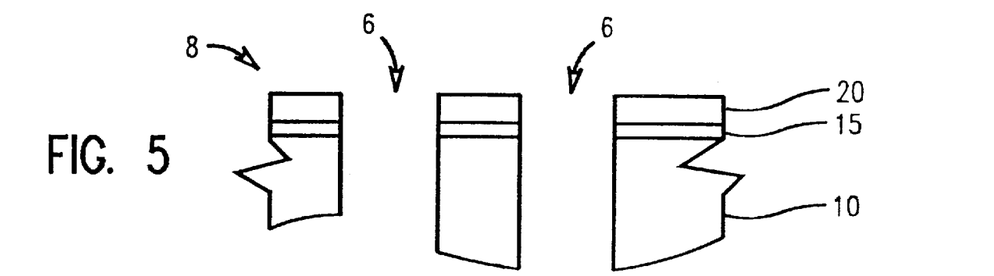
Figure 6:
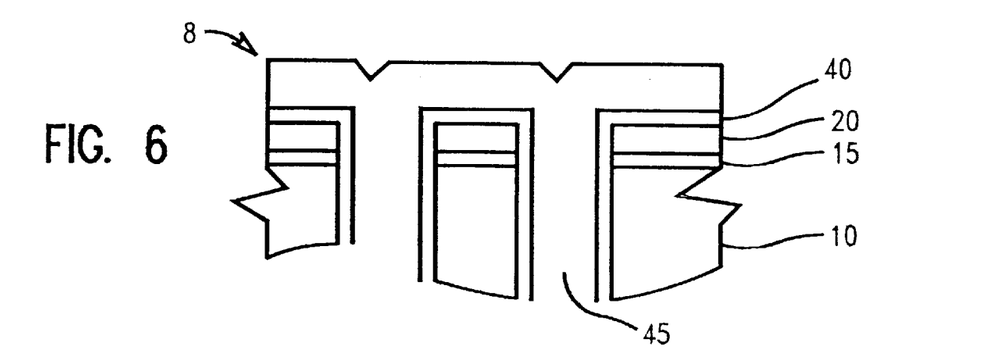
Figure 7:
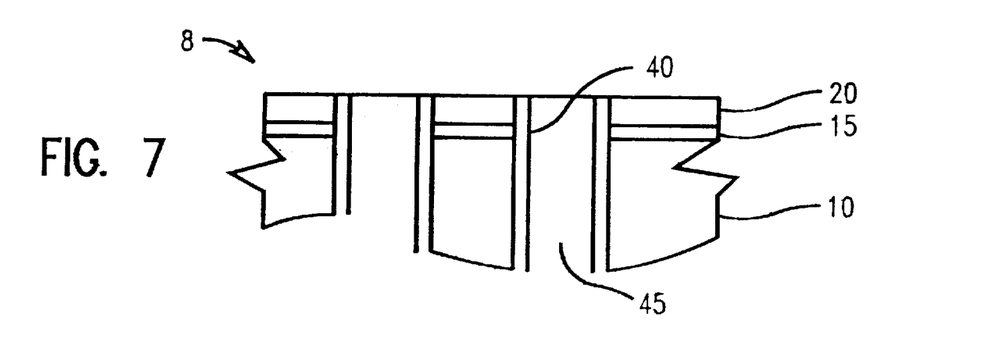

FIG. 5 shows the absence of the remaining BSG 25. The BSG is removed with a wet etch highly selective to the silicon oxide 15 of the pad dielectric. The etchants used comprise an $HF/H_2SO_4$ dip. The wet etch selectivity to silicon oxide 15 is about 50:1 wherein the BSG is 50 times more likely to be etched than the silicon oxide. This selectivity greatly minimizes undercut of the silicon oxide 15 allowing for greater post-etch processing ease. A node insulator 40 can be grown into trenches 6 then filling the trenches with a polysilicon 45 as shown in FIG. 6. Excess polysilicon and node insulator may be removed by such techniques as chemical mechanical polishing (CMP) down to the silicon nitride 20 as shown in FIG. 7, which acts as a CMP stop, for further masking and deep trench etching.

Figure 8:
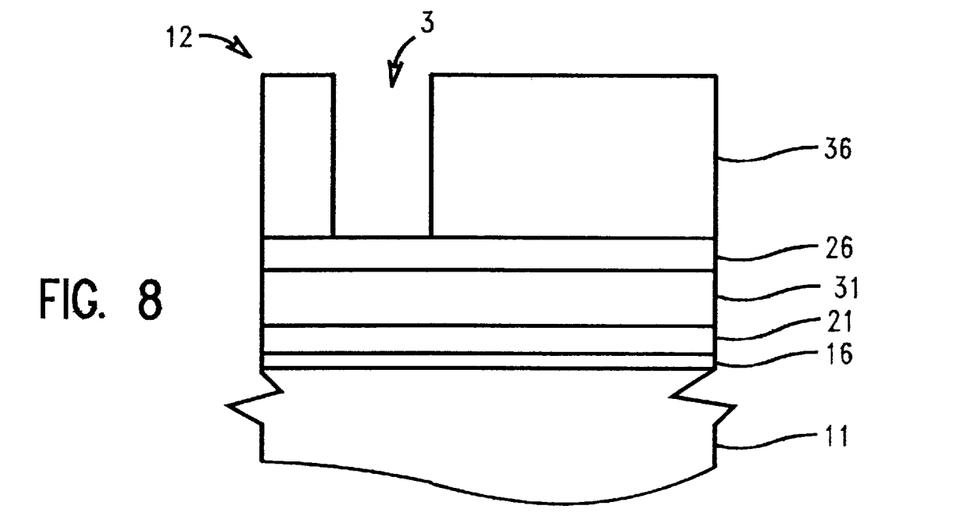
FIGS. 8–19 are elevational cross-sectional views showing a portion of a layered substrate of another specific preferred embodiment of the present invention showing the steps of a method of etching deep trenches having multiple dimensions and directions in silicon substrates.

FIGS. 8–19 show another preferred embodiment of the present invention in a related method of deep trench silicon etching wherein the trenches are different dimensions and directions. In FIG. 8, a method of etching a plurality of trenches having the same or different dimensions and directions in a silicon substrate comprises the initial steps of forming a pad dielectric layer and a hard mask layer on a silicon substrate 10 to form layered intermediate substrate 12. The pad dielectric layer comprises a layer of silicon oxide 16 deposited on substrate 10. A layer of silicon nitride 21 is deposited on the silicon oxide 16. A dual layer hard mask is formed over the pad dielectric layer wherein the two layers are of substantially the same thicknesses. The hard mask layer comprises a first layer of PECVD oxide 31, deposited on the silicon nitride 21, and a layer of BSG 26 deposited on the first layer of PECVD oxide 31.

Figure 9:
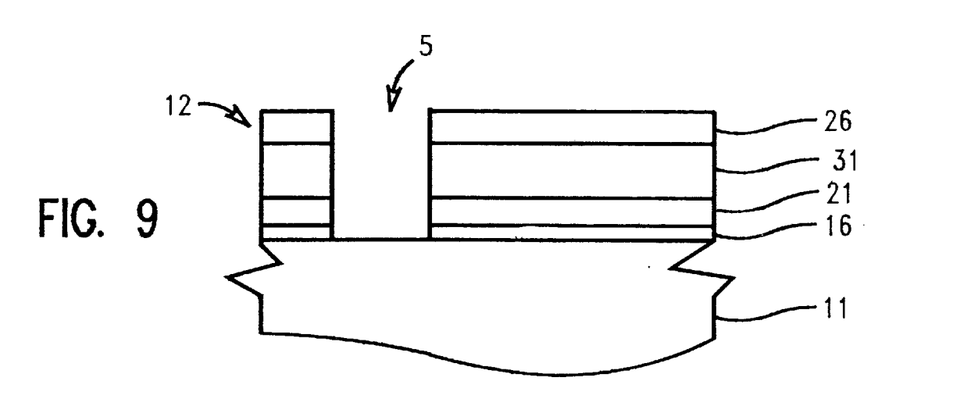
Figure 10:
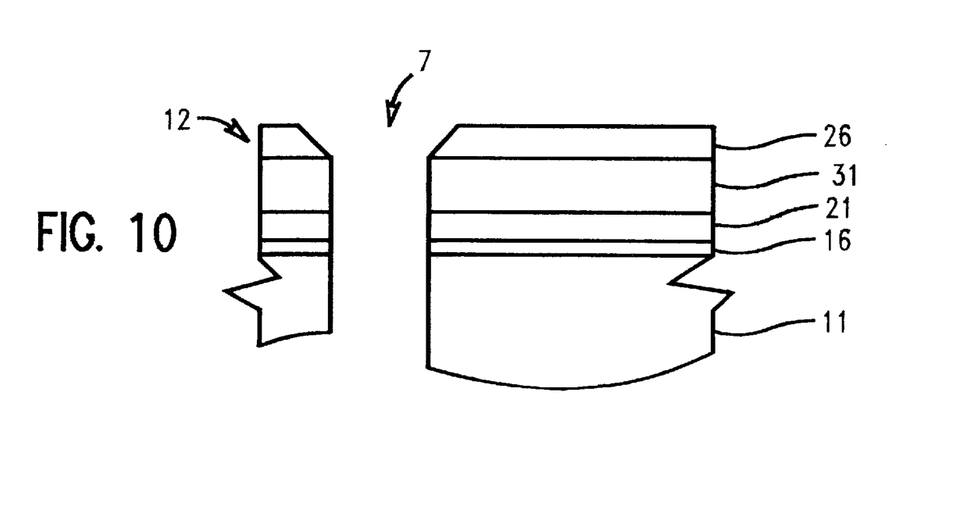

Layered intermediate substrate 12 is coated and patterned with resist layer 36 exposing the BSG 26 at contact areas 3. As shown in FIG. 9, the layers of BSG 26, PECVD oxide 31, silicon nitride 21, and silicon oxide 16 are etched exposing substrate 11 at contact areas 5. A reactive ion etching process with such etchants as $CHF_3/CF_4/Ar$ chemistry are suitable for etching through the layers. In FIG. 10, first silicon trench 7 is produced by etching substrate 11 to a desired depth using reactive ion etching with such etchants as $HBr/NF_3/He/O_2$. The BSG 26 is partially eroded during etching of substrate 11. The BSG 26 acts as a sacrificial hard mask layer which allows ease of post-etch processing as discussed below.

Figure 11:
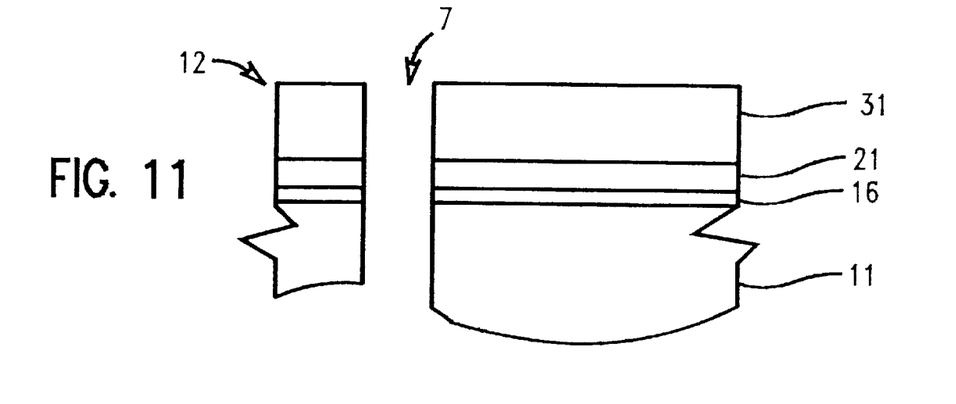
Figure 12:
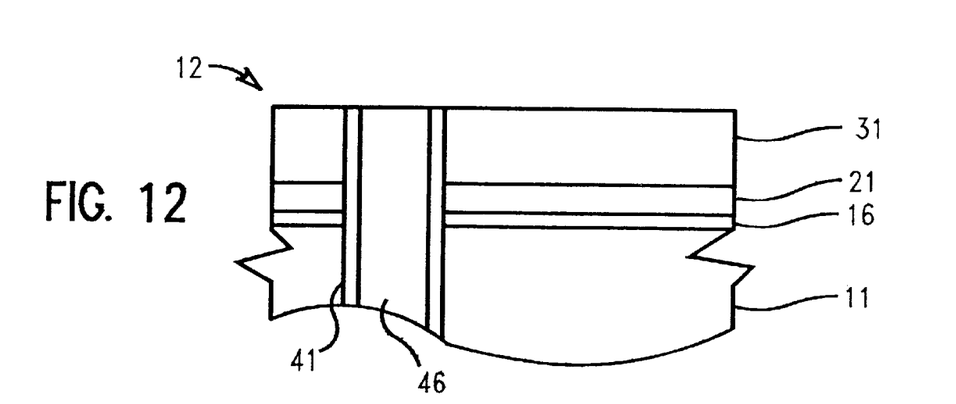

FIG. 11 depicts the trenched layered intermediate substrate 12 after the next step, which is removing any remaining BSG by contacting with an etchant that is highly selective to the pad dielectric and the PECVD oxide. This selectivity ensures that the BSG will be etched before the pad dielectric and the PECVD oxide. The high selectivity of an etchant, such as an $HF/H_2SO_4$ dip, to the pad dielectric and the PECVD oxide leaves a highly planar surface on the PECVD oxide 31 ideal for further processing of the semiconductor device. A node insulator 41 is grown in first silicon trench 7 followed by filling trench 7 with a polysilicon 46 as shown in FIG. 12. Any excess node insulator and polysilicon is removed by chemical mechanical polishing down to the first layer of PECVD oxide 31.

Figure 13:
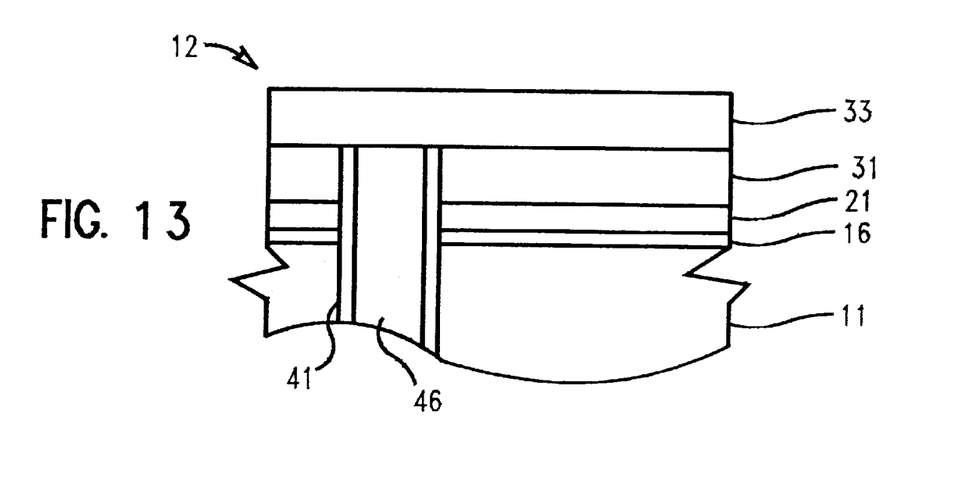
Figure 14:
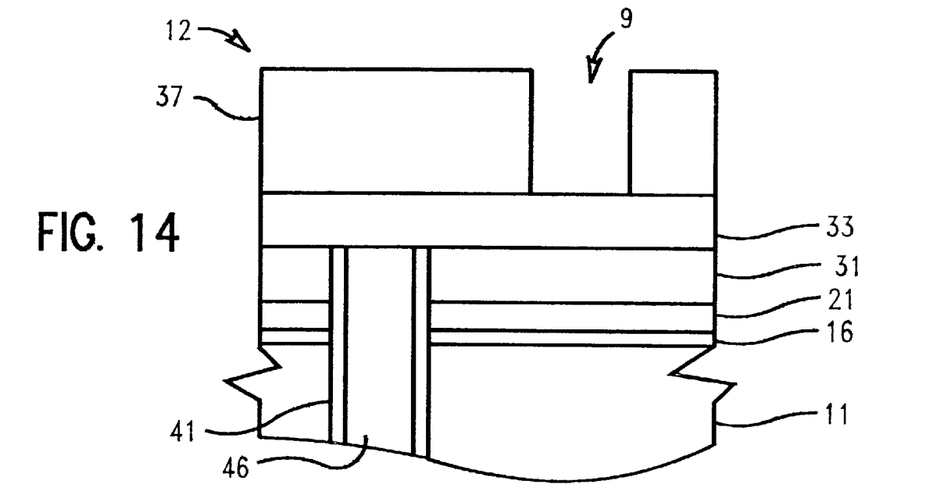
Figure 15:
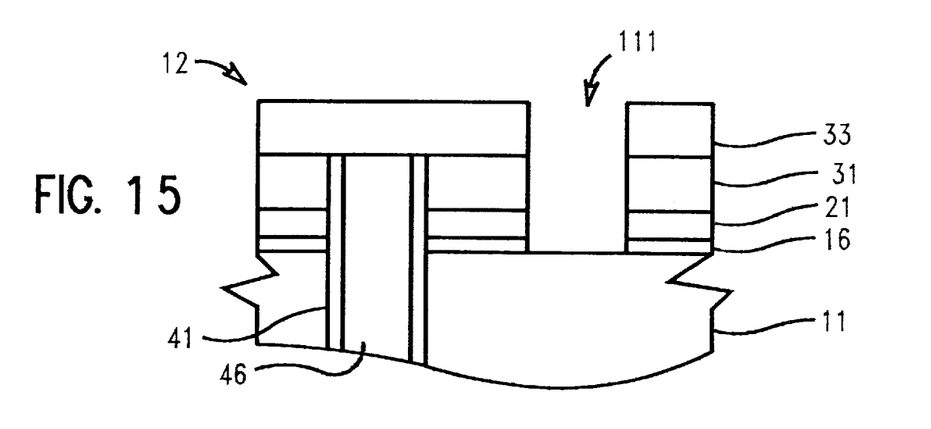
Figure 16:
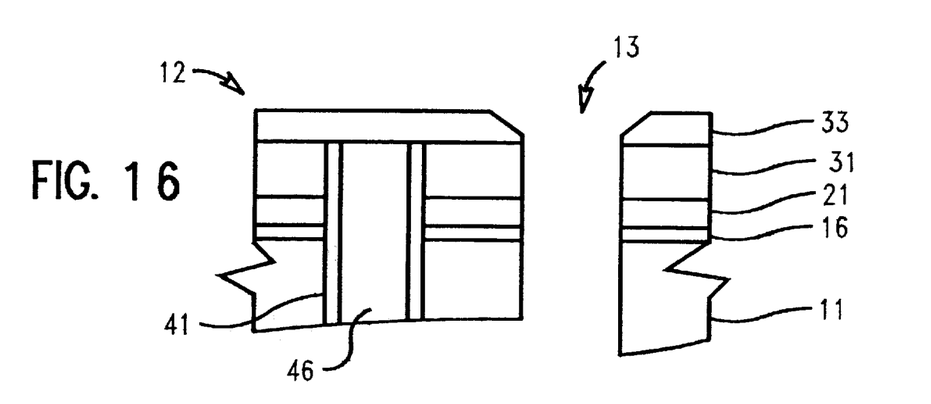

In order to form another silicon trench or a series of silicon trenches having the same or different dimension or direction, a subsequent layer of PECVD oxide 33, preferably having a thickness of about 2000 Å to about 4000 Å, is deposited on the first layer of PECVD oxide 31 as shown in FIG. 13. A subsequent resist layer 37 is deposited thereover and patterned to show trench 9 in FIG. 14. The two PECVD oxide layers 33, 31 and the layers of pad dielectric are etched using such etchants as $CHF_3/CF_4/Ar$ chemistry to expose substrate 11 at contact area 111. Substrate 11 is subsequently etched to form a subsequent silicon trench 13 as shown in FIG. 16. Again, substrate 11 may be etched using such reactive ion etchants as $HBr/NF_3/He/O_2$. The subsequent silicon trench 13 can have the same or different dimension or direction than that of the first silicon trench 7.

Figure 17:
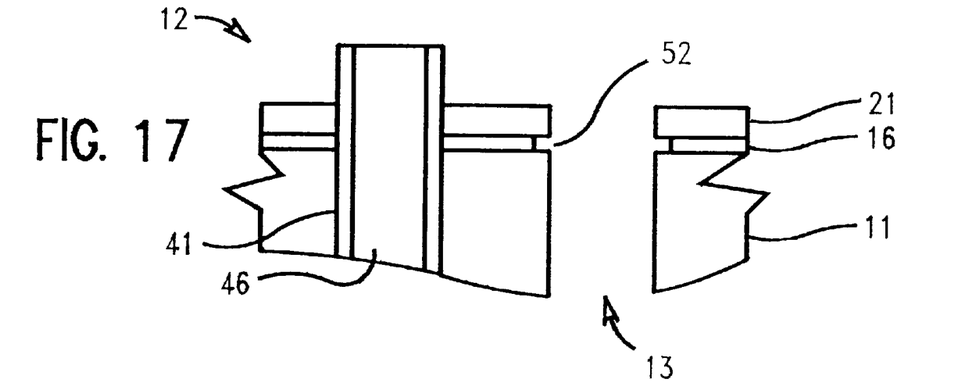
Figure 18:
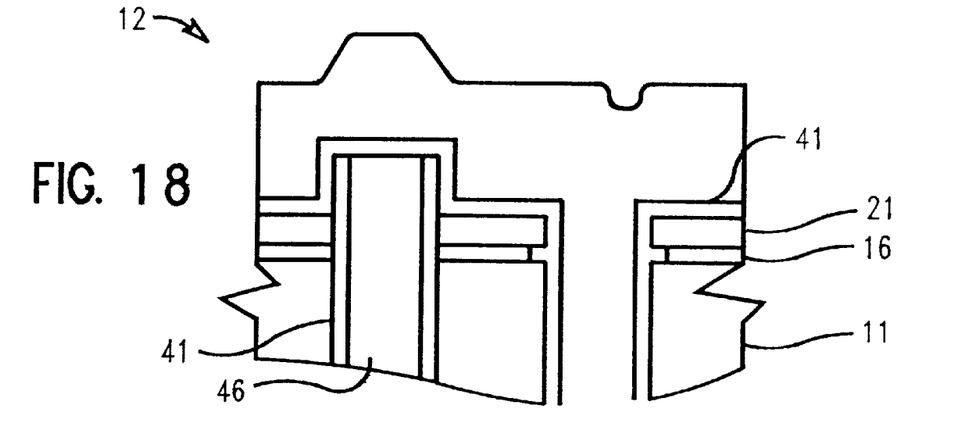
Figure 19:
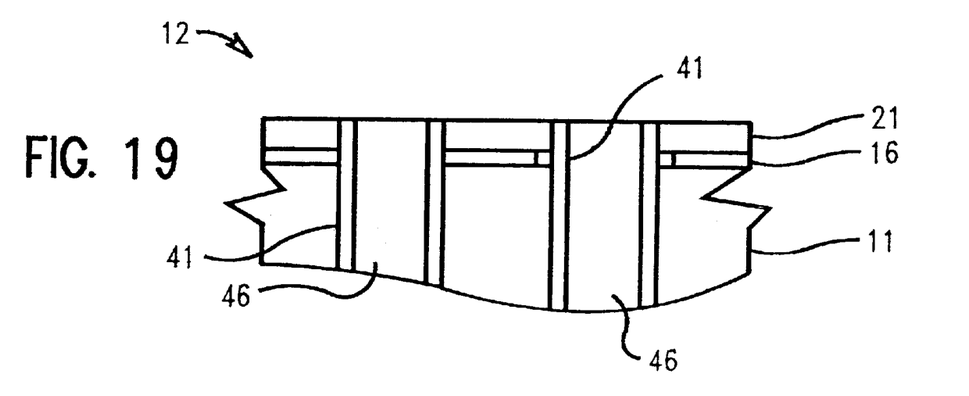

In FIG. 17, both layers of PECVD oxide 31, 33 are removed with such etchants as buffered hydrofluoric acid (BHF). It is noted that the pad oxide 16 may also be partially undercut 52 at this step. A node insulator 41 is grown in the subsequent silicon trench 13 and the trench is filled with polysilicon 46 as shown in FIG. 18. Depicted in FIG. 19 is the layered intermediate substrate 12 after undergoing chemically mechanically polishing down to pad nitride layer 21.

Thus, the above invention has been found to achieve the objects recited above. The present invention has improved accuracy and control during deep trench etching of silicon using a dual layer hard mask comprising PECVD oxide and BSG. The PECVD oxide layer protects the BSG. During deep trench etching of the silicon, reducing the sensitivity of the silicon etchants to BSG moisture contamination provides the accuracy and control to etch trenches of close proximity or trenches of the same or differing dimensions and directions. Moisture contamination from the BSG increases the etch rate of the silicon causing it to etch faster with less control.

The BSG provides ease of post-etch processing with regard to its removal. The wet etch used in removing the BSG is highly selective to the pad dielectric. This reduces undercut of the pad oxide and provides a highly planar topography ideal for further processing of the semiconductor device. Improved precision and control during deep trench silicon etch allows etching of trenches within close proximity having different dimensions and directions.

The present invention also provides an improved manufacturing process of DRAMs by reducing the deep trench process shifts due to BSG seasoning effects. Process shifts occur when a chamber that has just ran a TEOS/pad nitride hard mask product subsequently runs a BSG/pad nitride hard mask product. The BSG/pad nitride hard mask becomes eroded and the product starts to etch deeper requiring seasoning of the chamber when switching from TEOS to BSG product. Utilizing the present invention, the deep trench chamber no longer requires re-seasoning when running BSG/pad nitride hard mask product after running TEOS/pad nitride product.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of etching a plurality of trenches in a semiconductor substrate comprising the steps of:
   (a) providing a semiconductor substrate capable of being etched with a first etchant, having a layer of pad dielectric disposed thereon, said pad dielectric comprising a first layer and a second layer;
   (b) depositing a third layer comprising a material capable of selective removability with respect to said pad dielectric and said semiconductor substrate, said third layer being a first hard mask layer having a slower etch rate than said pad dielectric and semiconductor substrate when contacted with said first etchant;
   (c) depositing a fourth layer comprising a material having a slower etch rate than said semiconductor substrate and said third layer when contacted with said first etchant, said fourth layer being a second hard mask layer, said fourth layer acts as a sacrificial hard mask layer protecting the third layer during deep trench etching of the semiconductor substrate;
   (d) patterning at least one of said third and fourth layers to form a pattern for said trench;
   (e) etching through said third and fourth layers and said pad dielectric to pattern said substrate; and
   (f) etching said semiconductor substrate with said first etchant to form said trench, said fourth layer protecting said third layer from said first etchant by acting as said sacrificial hardmask, thereby completely removing said fourth layer while partially removing said third layer, said fourth layer reducing the sensitivity of first etchant to third layer moisture contamination thereby providing control in forming said trench.

2. The method according to claim 1, wherein step (a) is followed by step (b) and then by step (c).

3. The method according to claim 1, wherein step (b) comprises depositing a layer of borosilicate glass.

4. The method according to claim 1, wherein step (c) comprises depositing a layer of silicon oxide by plasma enhanced chemical vapor deposition.

5. The method according to claim 1, wherein step (e) comprises etching of said pad dielectric, said layer of material capable of selective removability with respect to pad dielectric, and said layer of material having a slower etch rate than said semiconductor substrate, without substantially etching said semiconductor substrate.

6. The method according to claim 1, wherein step (f) comprises reactive ion etching of said semiconductor substrate with an etchant comprising hydrogen bromide gas, nitrogen triflouride, oxygen with helium.

7. The method according to claim 6, wherein during step (f) nitrogen triflouride completely removes said fourth layer during etching of said semiconductor substrate to form said trench.

8. The method according to claim 1, further including in step (f) removing any remaining said third layer of material capable of selective removability with respect to said pad dielectric and said semiconductor substrate comprising dipping said semiconductor substrate in a hydrogen fluoride-sulfuric acid bath selective to said layers of pad dielectric and said semiconductor substrate wherein said third layer is 50 times more likely to be etched than said first layer of said pad dielectric thereby minimizing undercutting of said first layer of said pad dielectric.

9. A method of etching trenches of close proximity on a silicon substrate comprising the steps of:
   (a) providing a silicon substrate capable of being etched with a first etchant;
   (b) depositing a layer of pad dielectric over said silicon substrate, said pad dielectric comprising a first layer and a second layer;
   (c) depositing a third layer of borosilicate glass over said layers of pad dielectric, said third layer comprising a first hard mask layer of said borosilicate glass having a slower etch rate than said pad dielectric and said silicon substrate when contacted with said first etchant;
   (d) depositing a fourth layer of silicon oxide over said third layer of borosilicate glass, said fourth layer comprising a second hard mask layer of said silicon oxide having a slower etch rate than said silicon substrate and said first hard mask layer of borosilicate glass when contacted with said first etchant;
   (e) applying a resist layer and exposing the pattern on said third and fourth layers and said layers of pad dielectric;
   (f) etching said third and fourth layers and said layers of pad dielectric;
   (g) stripping the remaining resist layer; and
   (h) etching said silicon substrate with said first etchant to form said trenches, said fourth layer of silicon oxide protecting said third layer of borosilicate glass from said first etchant by acting as a sacrificial hardmask, thereby completely removing said fourth layer of silicon oxide while partially removing said third layer, said fourth layer of silicon oxide reducing the sensitivity of first etchant to third layer of borosilicate glass moisture contamination thereby providing control in forming said trench.

10. The method according to claim 9, further including step (i) removing any remaining borosilicate glass layer.

11. The method according to claim 9, further including step (j) growing a node insulator film within said trenches and filling said trenches with polysilicon.

12. The method according to claim 9, wherein step (c) comprises depositing a thicker layer of said layer of borosilicate glass than said layer of silicon oxide.

13. The method according to claim 9, wherein step (d) comprises depositing said layer of silicon oxide by plasma enhanced chemical vapor deposition.

14. The method according to claim 9, wherein step (f) comprises etching through said layers of silicon oxide, borosilicate glass, and pad dielectric without substantially etching said silicon substrate.

15. The method according to claim 9, wherein step (h) comprises etching using a reactive ion etchant whereby said layer of silicon oxide protects said layer of borosilicate glass during etching of said silicon substrate to form said trenches wherein the rate of erosion of said layer of borosilicate glass is reduced and the rate of etching of said silicon substrate is better controlled than with a layer of borosilicate glass alone.

16. A method of etching a plurality of trenches having the same or different dimensions and directions in a silicon substrate comprising the steps of:
   (a) providing a silicon substrate capable of being etched with a first etchant, having a layer of pad dielectric comprising a first layer and a second layer over said silicon substrate, and a dual layer hard mask comprising a third layer over said silicon substrate of silicon oxide deposited over said layers of said pad dielectric by plasma enhanced chemical vapor deposition, and a fourth layer over said silicon substrate of borosilicate glass deposited over said third layer of silicon oxide;
   (b) etching said layers of pad dielectric, silicon oxide and borosilicate glass in accordance with a desired pattern;
   (c) etching said silicon substrate with said first etchant to produce said plurality of trenches in said silicon substrate, said fourth layer of borosilicate glass protecting said third layer of silicon oxide from said first etchant by acting as a sacrificial hardmask, thereby substantially removing at least a portion of said layer of borosilicate glass, said layer of borosilicate glass reducing the sensitivity of first etchant to said third layer of silicon oxide moisture contamination thereby providing control in forming said plurality of trenches; and
   (d) removing remaining said layer of borosilicate glass with an etchant highly selective to said layer of silicon oxide and said layers of said pad dielectric to provide a planar surface on said third layer over said silicon substrate of silicon oxide after removing remaining said fourth layer over said silicon substrate of borosilicate glass, wherein said etchant is 50 times more likely to etch said third layer of borosilicate glass than said layer of said silicon oxide and said layers of said pad dielectric thereby minimizing undercutting of said first layer of said pad dielectric.

17. The method according to claim 16, wherein said third layer of silicon oxide and said fourth layer of borosilicate glass are of substantially equal thickness.

18. The method according to claim 16, wherein step (c) forms a first plurality of trenches and further including the steps of:
   (e) growing a first layer of node insulator within said first plurality trenches then filling said first plurality of trenches with polysilicon; and
   (f) removing any excess polysilicon and node insulator forming a planar surface on the third layer over said silicon substrate of silicon oxide.

19. The method according to claim 18, wherein step (f) comprises chemical mechanical polishing of any excess polysilicon to achieve a surface planar to said layer of silicon oxide.

20. The method according to claim 18, further including etching subsequent trenches comprising the steps of:
   (g) depositing a subsequent layer of silicon oxide over said first layer of silicon oxide by plasma enhanced chemical vapor deposition;
   (h) etching through said first and subsequent layers of silicon oxide, and said layer of pad dielectric;
   (i) etching subsequent silicon trenches;
   (j) removing said first and subsequent layers of silicon oxide;
   (k) growing a subsequent layer of node insulator within said subsequent trenches and filling said subsequent trenches with polysilicon; and
   (l) removing any excess polysilicon and node insulator down to said layer of pad dielectric.

21. The method according to claim 20, wherein said subsequent trenches have different dimensions and directions than said first plurality of silicon trenches.

22. The method according to claim 20, wherein step (l) comprises chemical mechanical polishing of excess polysilicon and node insulator to achieve a surface planar to said layer of pad dielectric.

23. The method according to claim 20, wherein said subsequent layer of silicon oxide has a thickness of about 2000 Å to about 4000 Å.

* * * * *